(12) United States Patent
Wei et al.

(10) Patent No.: US 9,275,890 B2
(45) Date of Patent: Mar. 1, 2016

(54) METHODS OF FORMING ALIGNMENT MARKS AND OVERLAY MARKS ON INTEGRATED CIRCUIT PRODUCTS EMPLOYING FINFET DEVICES AND THE RESULTING ALIGNMENT/OVERLAY MARK

(71) Applicant: GLOBALFOUNDRIES Inc., Grand Cayman (KY)

(72) Inventors: Andy C. Wei, Queensbury, NY (US); Jeong Soo Kim, Clifton Park, NY (US); Francis M. Tambwe, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 3 days.

(21) Appl. No.: 13/834,608

(22) Filed: Mar. 15, 2013

(65) Prior Publication Data

US 2014/0264631 A1 Sep. 18, 2014

(51) Int. Cl.
*H01L 21/76* (2006.01)
*H01L 21/762* (2006.01)
*H01L 23/544* (2006.01)
*H01L 21/308* (2006.01)
*H01L 27/088* (2006.01)

(52) U.S. Cl.
CPC ...... *H01L 21/76224* (2013.01); *H01L 21/3086* (2013.01); *H01L 23/544* (2013.01); *H01L 27/0886* (2013.01); *H01L 2223/5442* (2013.01); *H01L 2223/54426* (2013.01); *H01L 2223/54453* (2013.01); *H01L 2924/0002* (2013.01)

(58) Field of Classification Search
CPC ............... H01L 21/76229; H01L 27/10826; H01L 27/1211; H01L 29/0886; H01L 29/66795; H01L 29/66818; H01L 29/785
USPC .................................... 438/401, 703
See application file for complete search history.

(56) References Cited

U.S. PATENT DOCUMENTS

| | | | | |
|---|---|---|---|---|
| 8,354,320 B1 * | 1/2013 | Xie et al. | | 438/279 |
| 2013/0045580 A1 * | 2/2013 | Cho | | 438/296 |
| 2014/0065832 A1 * | 3/2014 | Hsieh et al. | | 438/703 |

\* cited by examiner

*Primary Examiner* — Pamela E Perkins
(74) *Attorney, Agent, or Firm* — Amerson Law Firm, PLLC

(57) ABSTRACT

One illustrative method disclosed herein includes forming a plurality of spaced-apart fin structures in a semiconductor substrate, wherein the fin structures define a portion of an alignment/overlay mark trench where at least a portion of an alignment/overlay mark will be formed, forming at least one layer of insulating material that overfills the alignment/overlay mark trench and removing excess portions of the layer of insulating material positioned above an upper surface of the plurality of fins to thereby define at least a portion of the alignment/overlay mark positioned within the alignment/overlay mark trench. A device disclosed herein includes a plurality of spaced-apart fin structures formed in a semiconductor substrate so as to partially define an alignment/overlay mark trench, an alignment/overlay mark consisting only of at least one insulating material positioned within the alignment/overlay mark trench, and a plurality of FinFET semiconductor devices formed in and above the substrate.

16 Claims, 12 Drawing Sheets

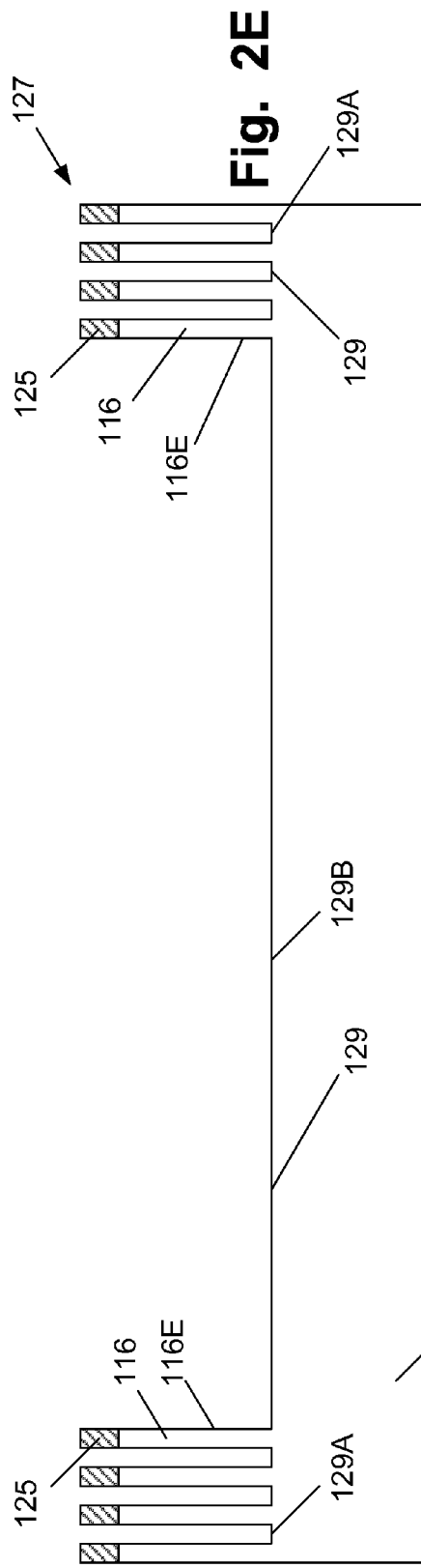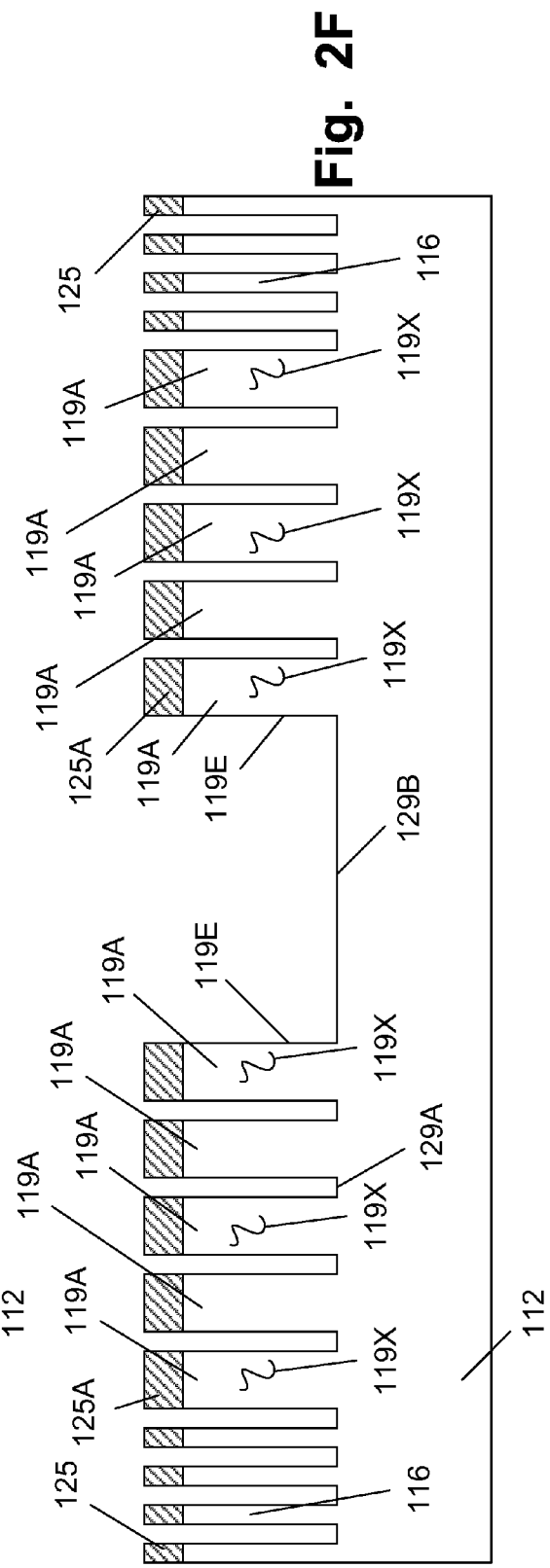

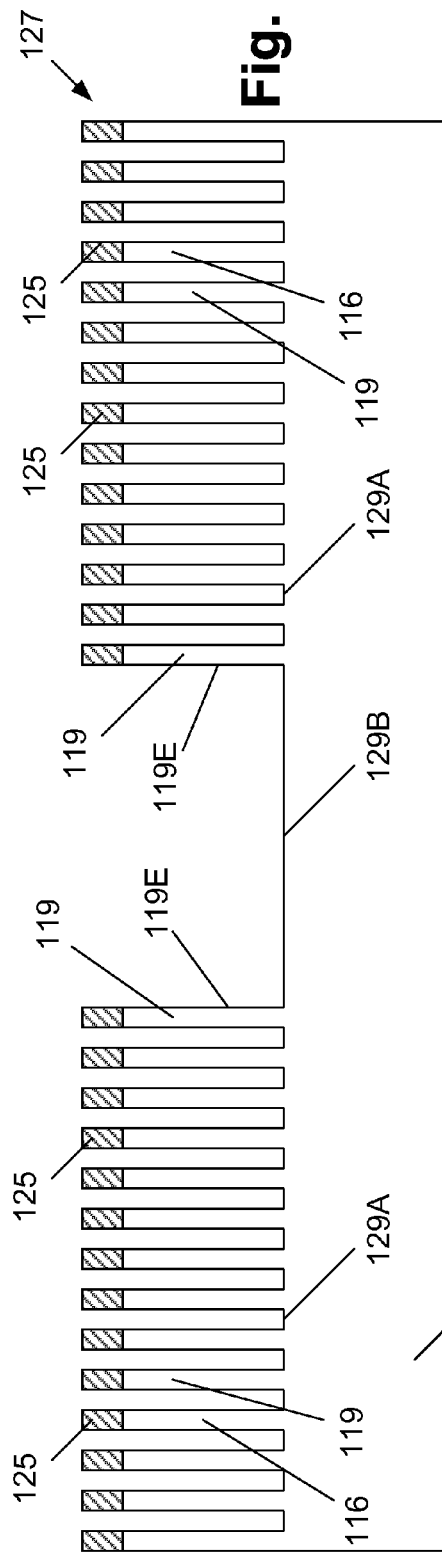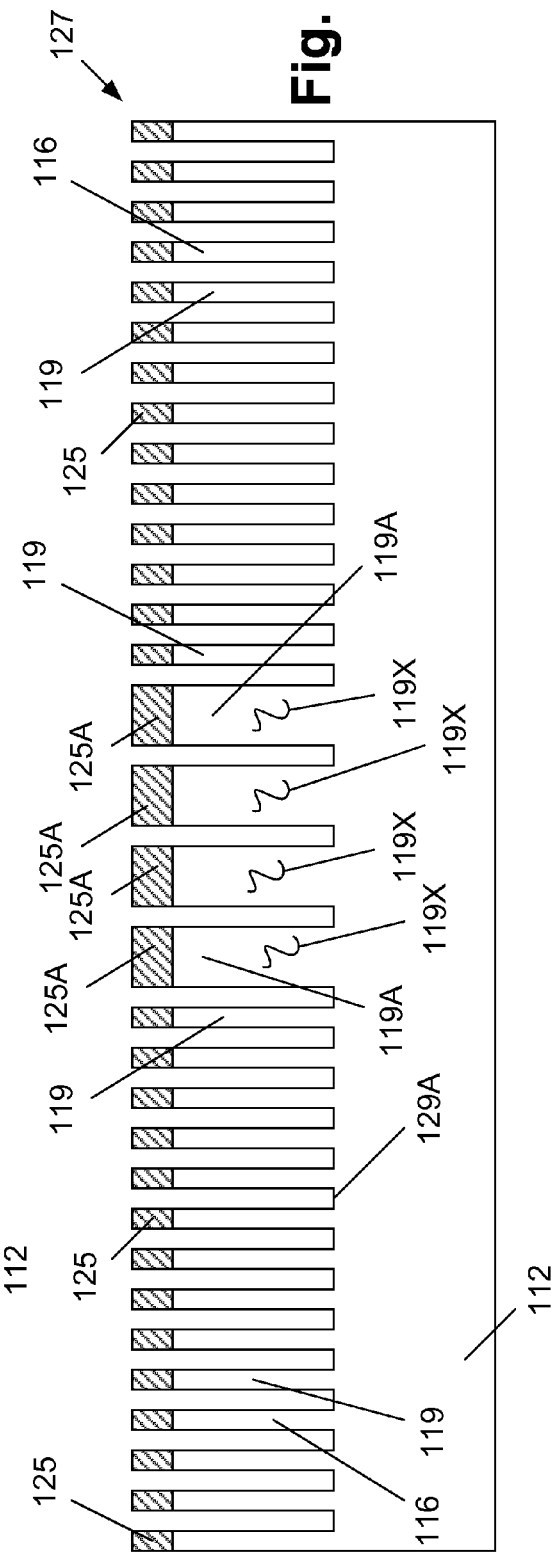

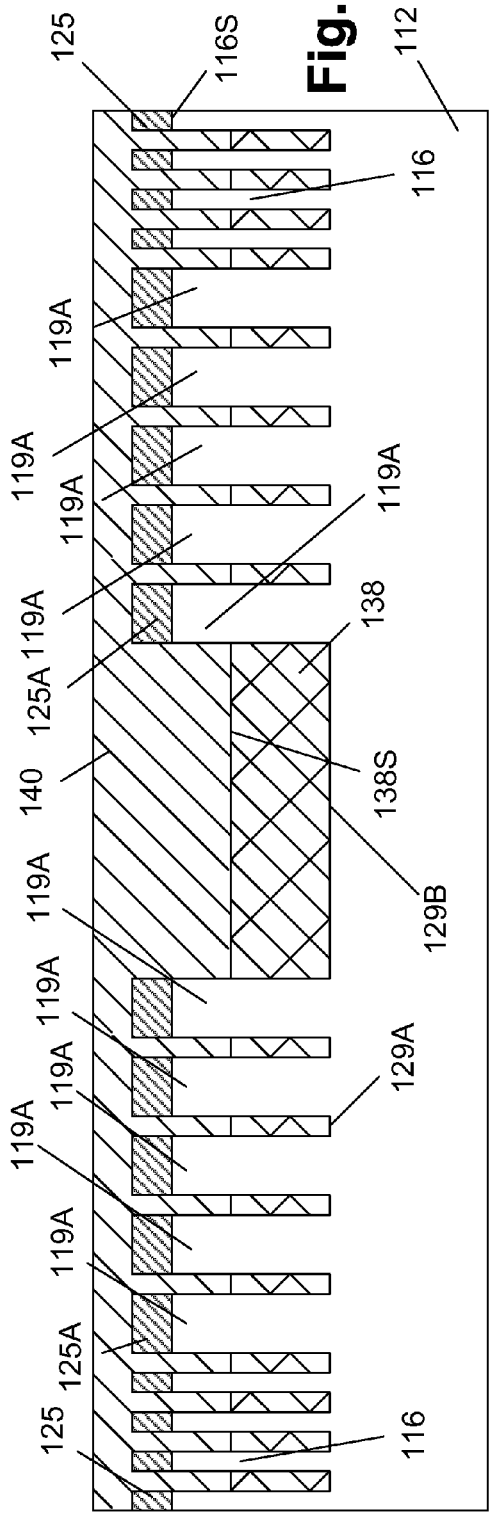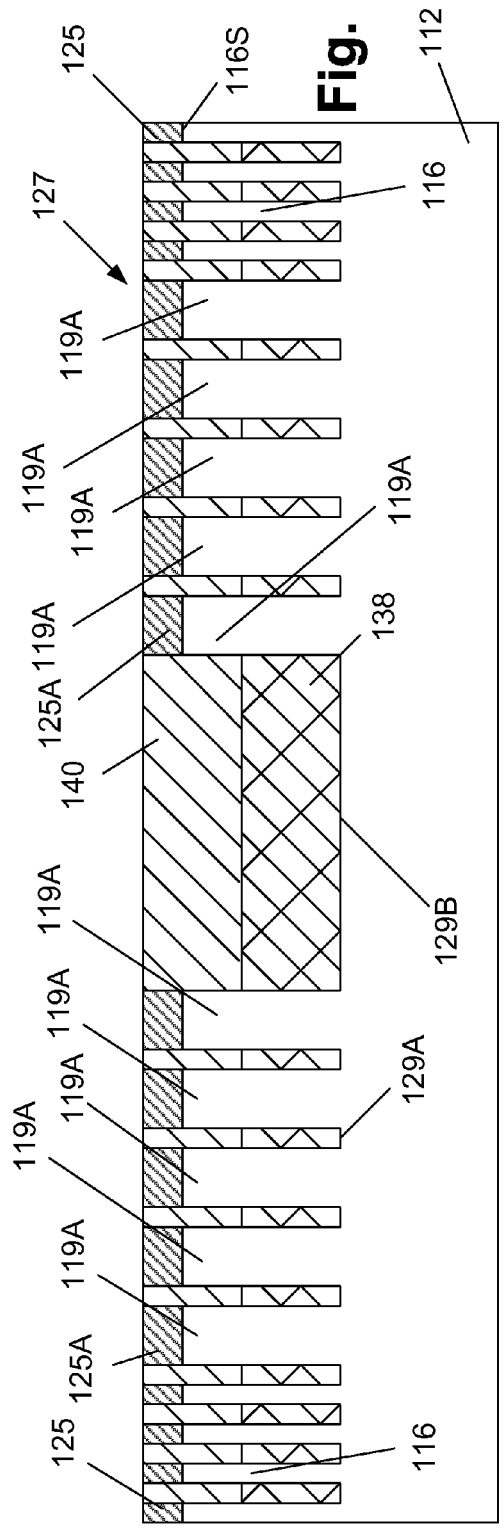

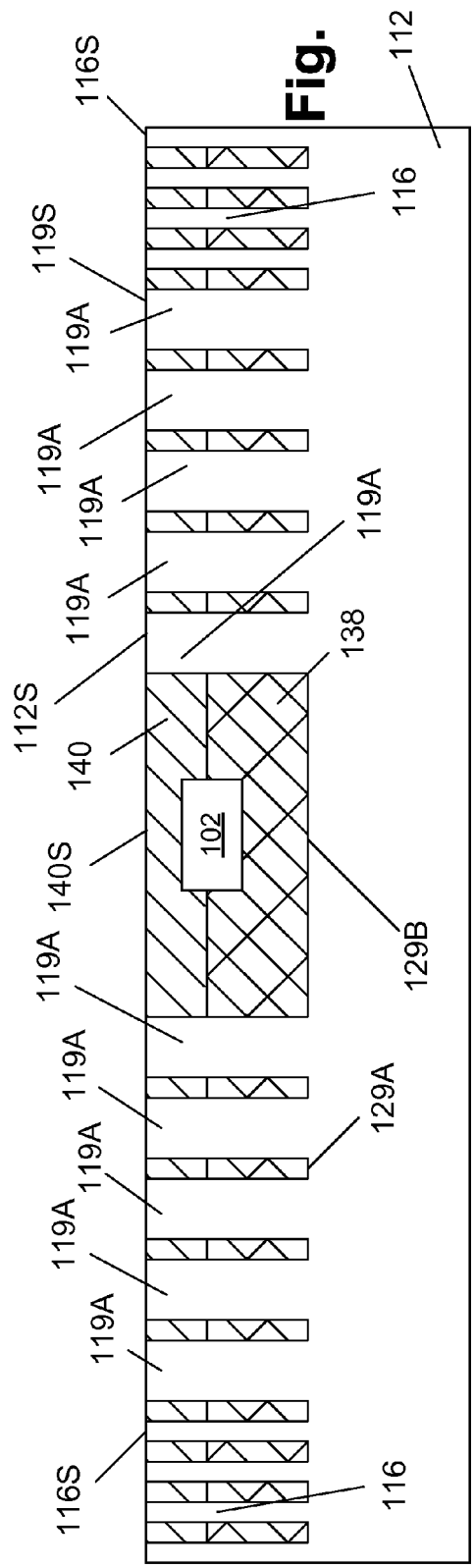

METHODS OF FORMING ALIGNMENT MARKS AND OVERLAY MARKS ON INTEGRATED CIRCUIT PRODUCTS EMPLOYING FINFET DEVICES AND THE RESULTING ALIGNMENT/OVERLAY MARK

BACKGROUND OF THE INVENTION

1. Field of the Invention

Generally, the present disclosure relates to the manufacture of sophisticated semiconductor devices, and, more specifically, to various methods of forming alignment marks and overlay marks on integrated circuit products that employ FinFET semiconductor devices, and the associated products that include such alignment marks.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as so-called short channel effects, wherein the characteristic of the FET as an active switch is degraded.

In contrast to a planar FET, which has a generally planar structure, there are so-called 3D devices, such as a FinFET device, which has a three-dimensional structure. More specifically, in a FinFET, one or more generally vertically positioned, fin-shaped active areas are formed and a gate electrode encloses both of the sides and the upper surface of the fin-shaped active areas to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width under the channel and thereby reduce the short channel effects. Also, in a FinFET, the junction capacitance at the drain region of the device is greatly reduced, which tends to reduce at least some short channel effects.

In general, manufacturing semiconductor devices involves performing numerous process operations, e.g., deposition processes, etching processes, ion implanting processes, lithography processes, heating processes, etc., in a given sequence or process flow to form the desired integrated circuit product. The device is manufactured, more or less, layer-by-layer until the device is completed. In manufacturing integrated circuit devices, it is vitally important that a subsequently formed structure or layer be accurately located or positioned relative to a previously formed layer or structure. Without proper alignment of the structures and layers as the device is formed, the device may not operate as efficiently as intended or, in some cases, may not operate at all. For example, if a conductive contact to a gate structure of a transistor is misaligned to the point that it does not conductively contact the intended gate structure, then the transistor will not function. As another example, even in cases where a first and second conductive contact are sufficiently aligned such that there is a conductive path established between the two structures, there may be sufficient misalignment between the conductive contacts such that the resistance between the two conductive contacts is greater than anticipated by the design process, thereby leading to reduced operating efficiencies. In an effort to insure proper alignment of the various structures and layers during semiconductor device manufacturing, manufacturers employ various alignment marks and overlay techniques. Such alignment marks may take a variety of forms, e.g., cross-shaped, chevron-type patterns, a grid of lines, numbers, letters, etc. The number and location of such alignment marks may vary depending on the particular application and/or the device under construction. For example, such alignment marks may be located in the scribe lines of a substrate.

Device designers are under constant pressure to increase the operating speed and electrical performance of transistors and integrated circuit products that employ such transistors. In general, the fins of a FinFET semiconductor device are formed by etching a plurality of fin-forming trenches in a semiconducting substrate. As FinFET devices have been scaled to meet ever increasing performance and size requirements, the width of the fins has become very small, and the fin pitch has also been significantly decreased. One manufacturing technique that is employed in manufacturing FinFET devices employing such small fins and having such small fin pitches is to initially form a so-called "sea-of-fins" across the substrate. Thereafter, some of the fins are removed from areas where isolation regions will be formed. Using this "sea-of-fins" type manufacturing approach, better accuracy and repeatability may be achieved in forming the fins to very small dimensions due to the more uniform environment in which the etching process that forms the fin-forming trenches, and thus the fins, is performed.

FIGS. 1A-1B are a cross-sectional view and a plan view, respectively, of a discrete portion of an illustrative integrated circuit product 10 at an early stage of manufacture. The product 10 is at the point of fabrication where the "sea-of-fins" 16 has been initially formed by forming a plurality of fin-forming trenches 20 in the substrate 12. In one example, the width 16W of the fins 16 may be about 10-20 nm, and the fin pitch 16P may be on the order of about 30-80 nm. The depth 20D of the fin-forming trenches 20 may be on the order of about 70-200 nm. A layer of insulating material 22, e.g., silicon dioxide, is positioned between the fins 16 at this point in the process. The structure depicted in FIGS. 1A, 1B may be achieved by etching the substrate 12 through a patterned mask layer, typically a hard mask layer, to define the fin-forming trenches 20, over-filling the trenches 20 with the insulating material 22 and performing one or more chemical mechanical polishing (CMP) processes to remove the excess insulating material 22 positioned outside of the fin-forming trenches 20. The hard mask layer may be formed by performing traditional deposition/photolithography/etching techniques. In other cases, the hard mask layer may be formed by performing well-known sidewall image transfer techniques.

FIGS. 1C-1D are a cross-sectional view and a plan view, respectively, of the product 10 at a very high level so as to show, in a relative sense, the formation of physically larger structures on the substrate 12. In FIGS. 1C-1D, the fins 16 are depicted as isolated dark lines with insulating material 22, such as silicon dioxide, positioned between the fins 16. FIG. 1C just depicts the "sea of fins" 16, whereas FIG. 1D depicts a portion of the product 10 that includes a relatively large region 22A of insulating material where an illustrative, cross-shaped alignment mark 24 has been formed. In general, the alignment mark 24 is formed from a subset or portion of the plurality of the individual fins 16 and it is surrounded by the large region 22A of insulating material. While the individual fins 16 are very small, the alignment mark 24 is, in a relative sense, much larger. For example, the alignment mark 24 may have an overall height 24H that may be about 2-4 µm and an overall width 24W of about 2-4 µm. The dimension 24X may be on the order of about 1 µm.

The alignment mark 24 may be formed as follows. After the "sea-of-fins" 16 has been formed, as shown in FIG. 1C, some of the fins 16 (or portions thereof) must be removed to create room for the isolation structures (not shown) that will ultimately be formed to electrically isolate the individual FinFET devices, and the area to be occupied by the large region 22A of insulating material where the alignment mark 24 will be formed after the large region 22A is filled with insulating material 22. FIG. 1D, depicts the device 10 after the insulating material 22 has been deposited on the substrate and after a CMP process has been performed that typically stops on the fins 16. This process effectively defines the alignment mark 24 that is positioned in the large area 22A of insulating material and fills the fin-forming trenches 20 in the remaining portions of the sea-of-fins 16. The tools and equipment that use the alignment mark 24 for alignment purposes can detect or "see" a difference between the silicon fins 16 and the surrounding large area 22A of insulating material 22 and thereby recognize and align to the alignment mark 24.

While the aforementioned process has been used to form integrated circuit products that employ FinFET devices, it is not without drawbacks. More specifically, the CMP processes that are performed to planarize the upper surface 22S (see FIG. 1A) of the layer of insulating material 22 with the upper surface 16S (see FIG. 1A) of the fins 16 are very difficult to control. Moreover, trying to form the alignment mark 24 from a relatively isolated group of the relatively small fins 16 within the relatively large area 22A of insulating material 22 may lead to certain problems. For example, as shown in FIG. 1E, such CMP processes may lead to unacceptable dishing or smearing of the isolation material 22 and or destruction of at least the upper portion of some of the fins 16, as indicated with the reference number 25. As a result, the alignment mark 24 becomes distorted from what is intended by the design process. Such distortion of the alignment mark 24 can make it more difficult if not impossible to locate and/or to make proper alignments relative to the now-distorted alignment mark 24 depicted in FIG. 1E.

The present disclosure is directed to various methods of forming alignment marks on integrated circuit products that employ FinFET devices, and integrated circuit products incorporating such alignment marks, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming alignment marks and overlay marks on integrated circuit products that employ FinFET semiconductor devices, and the associated products that include such alignment/overlay marks. One illustrative method disclosed herein includes forming a plurality of spaced-apart fin structures in a semiconductor substrate wherein the fin structures define a portion of an alignment/overlay mark trench where at least a portion of an alignment/overlay mark will be formed, forming at least one layer of insulating material that overfills the alignment/overlay mark trench and removing excess portions of the layer of insulating material positioned above an upper surface of the plurality of fins to thereby define at least a portion of the alignment/overlay mark positioned within the alignment/overlay mark trench.

One illustrative device disclosed herein includes a plurality of spaced-apart fin structures formed in a semiconductor substrate so as to partially define an alignment/overlay mark trench, an alignment/overlay mark consisting only of at least one insulating material positioned within the alignment/overlay mark trench and a plurality of FinFET semiconductor devices formed in and above the substrate.

BRIEF DESCRIPTION OF THE DRAWINGS

The disclosure may be understood by reference to the following description taken in conjunction with the accompanying drawings, in which like reference numerals identify like elements, and in which:

FIGS. 2A-2L depict one illustrative embodiment of a method disclosed herein of forming an alignment/overlay mark and fins for an integrated circuit product that employs FinFET semiconductor devices as well as an illustrative embodiment of such an alignment/overlay mark.

Figure 1A:
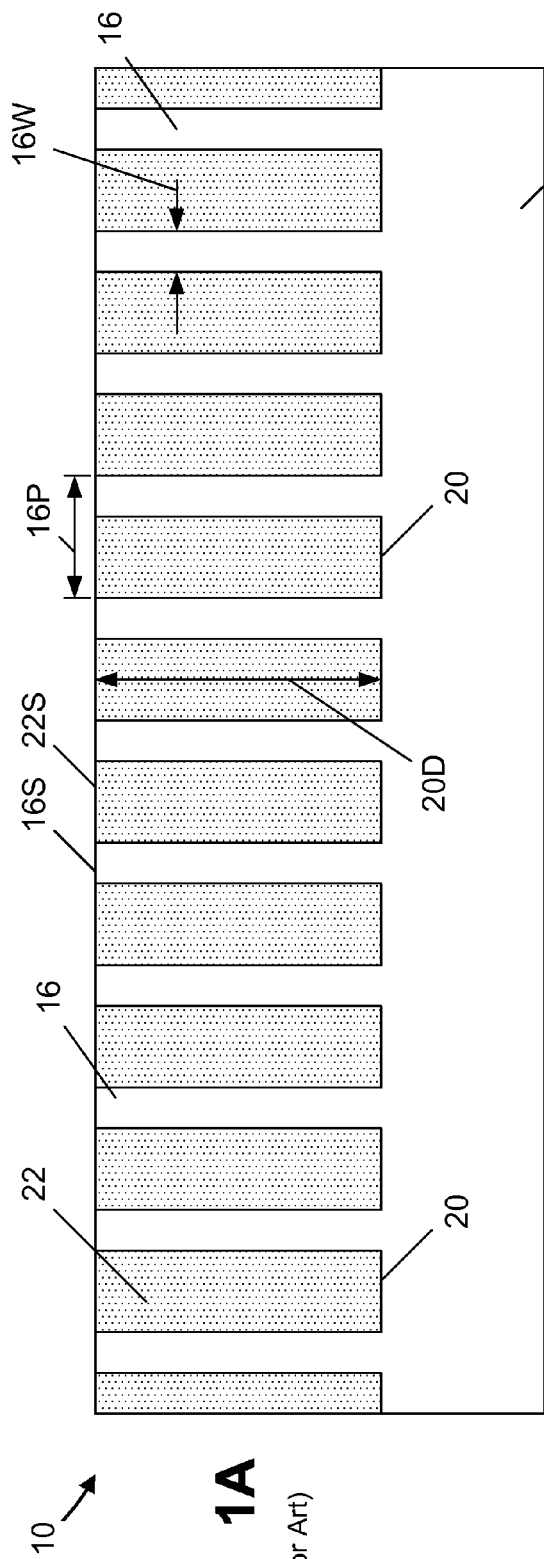
FIGS. 1A-1E depict various illustrative problems that may be encountered in alignment structures on integrated circuit products that employ FinFET semiconductor devices.
Figure 1B:
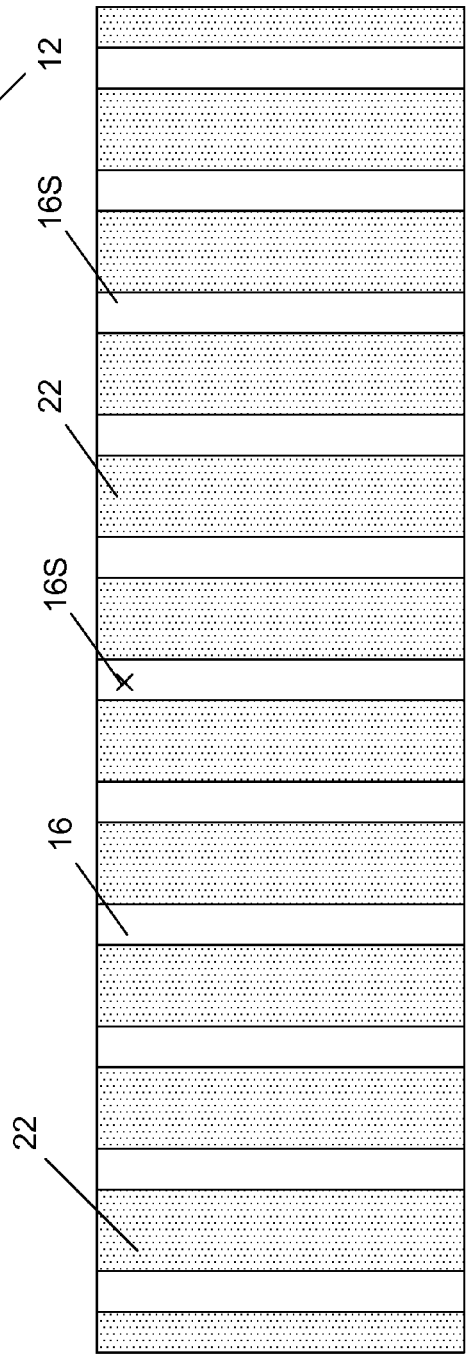
Figure 1C:
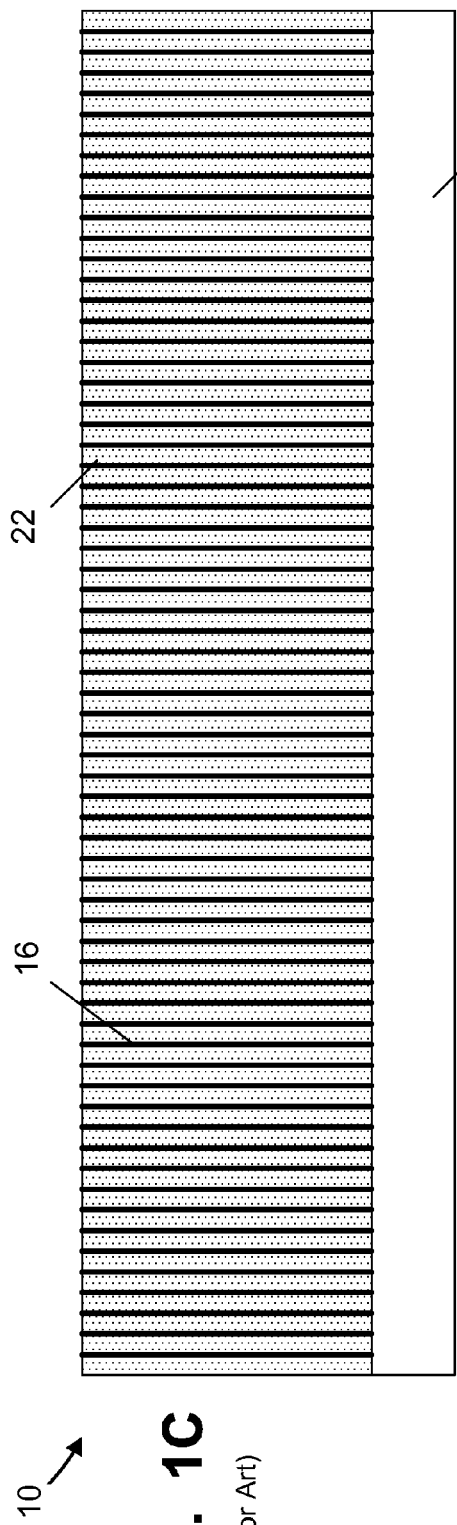
Figure 1D:
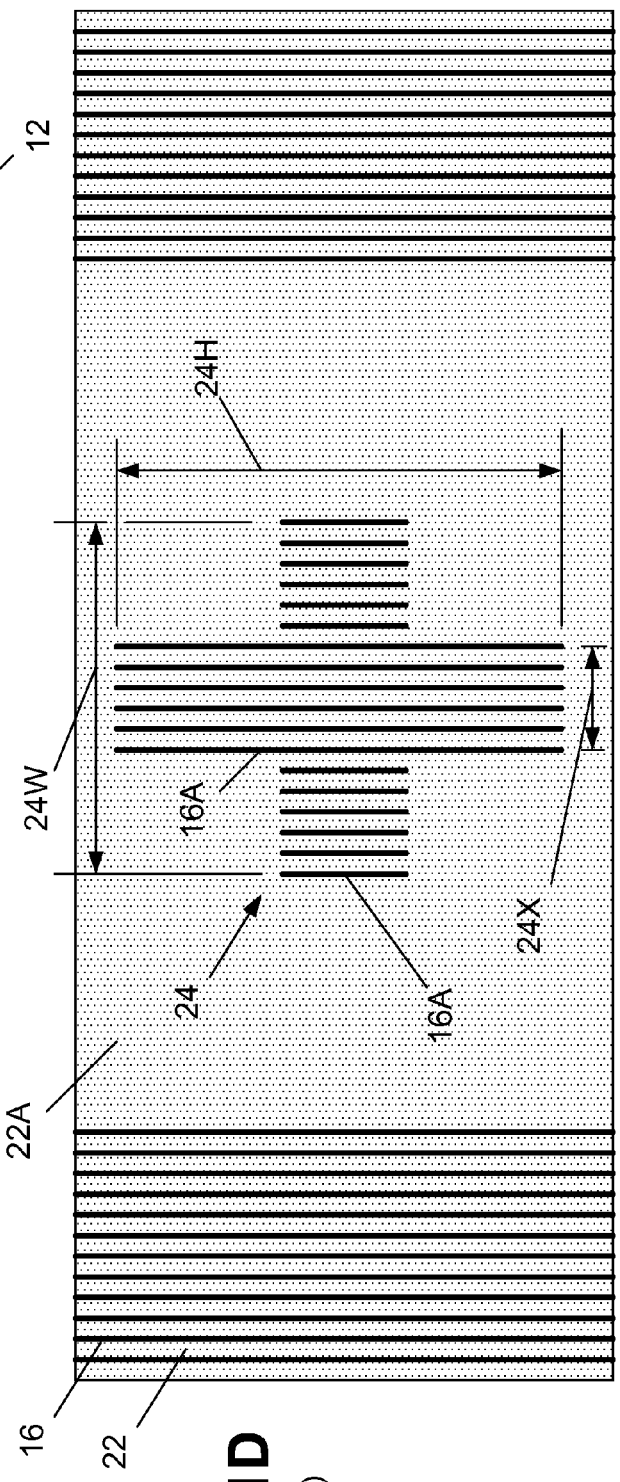
Figure 1E:
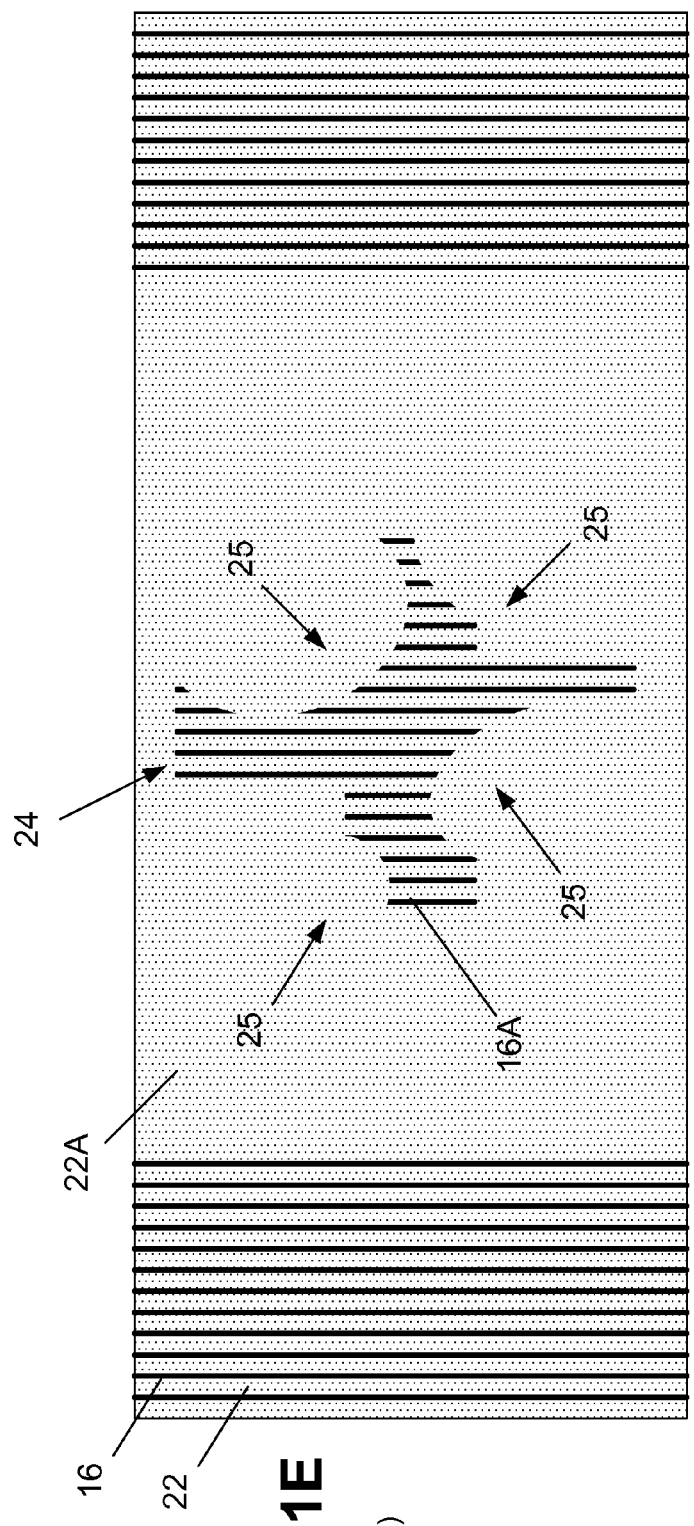

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming alignment marks and/or overlay marks on integrated circuit products that employ FinFET semiconductor devices, and the associated products that include such alignment marks. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIGS. 2A-2L depict various illustrative embodiments of various methods disclosed herein of forming alignment marks and/or overlay marks on an integrated circuit product 100 that includes multiple FinFET semiconductor devices. Hereinafter, the term "alignment/overlay mark" will be used in this specification and in the claims to indicate that the referenced mark structure can be used for either alignment purposes, overlay purposes or both. As will be recognized by those skilled in the art after a complete reading of the present application, the illustrative integrated circuit product 100 described herein may be manufactured using either N-type FinFET devices or P-type FinFET devices or a combination of such devices (CMOS technology). Additionally, the integrated circuit product 100 may also include various planar devices, e.g., FETs. In this illustrative embodiment, the integrated circuit product 100 is formed above a semiconductor substrate 112 that has a bulk semiconductor material configuration. The substrate 112 may also have a silicon-on-insulator (SOI) configuration that includes a bulk silicon layer, a buried insulation layer and an active layer, wherein semiconductor devices are formed in and above the active layer. The substrate 112 may be made of silicon or it may be made of materials other than silicon. Thus, the terms "substrate," "semiconducting substrate" or "semiconductor substrate" should be understood to cover all semiconductor materials of whatever form or configuration.

Figure 2A:
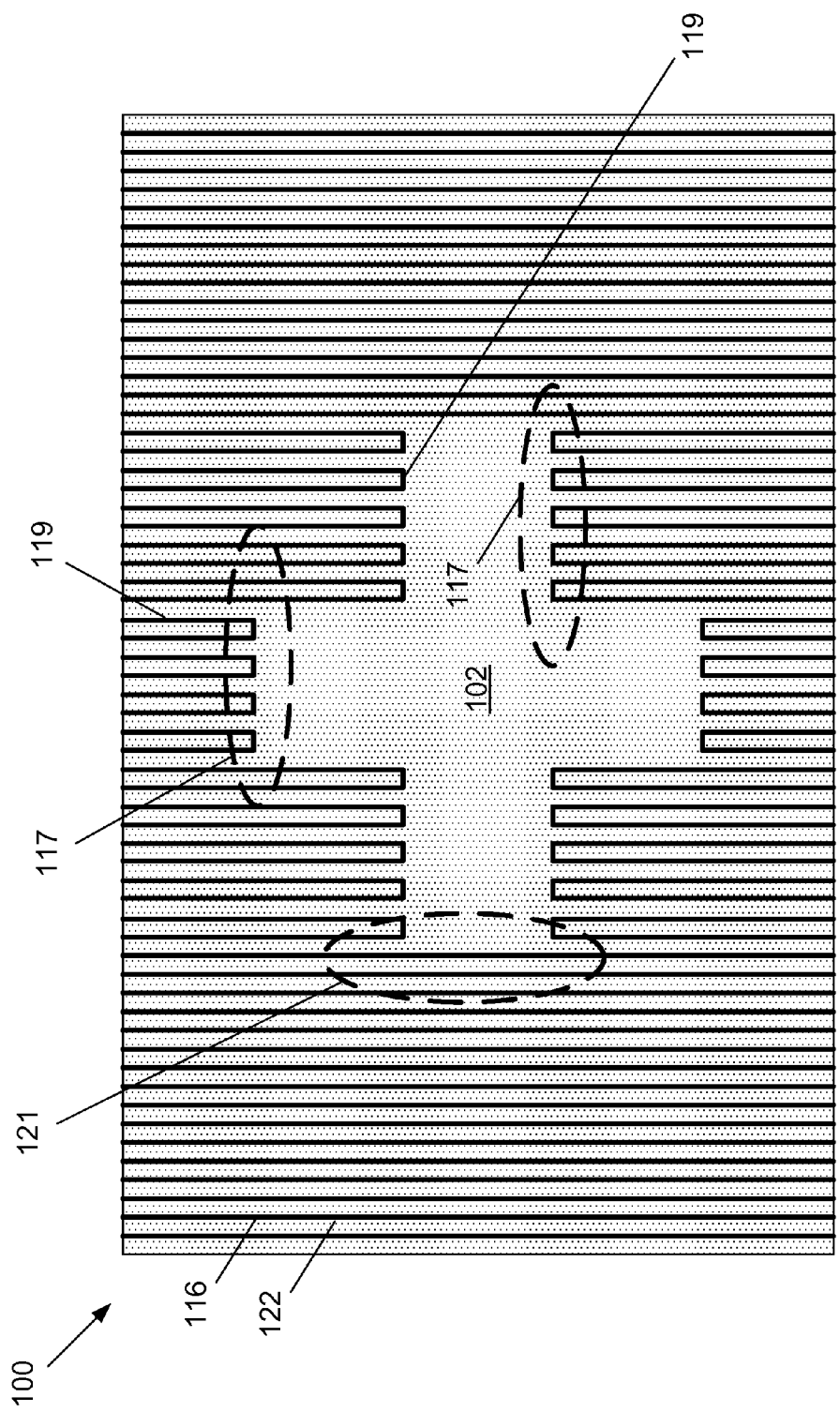
Figure 2B:
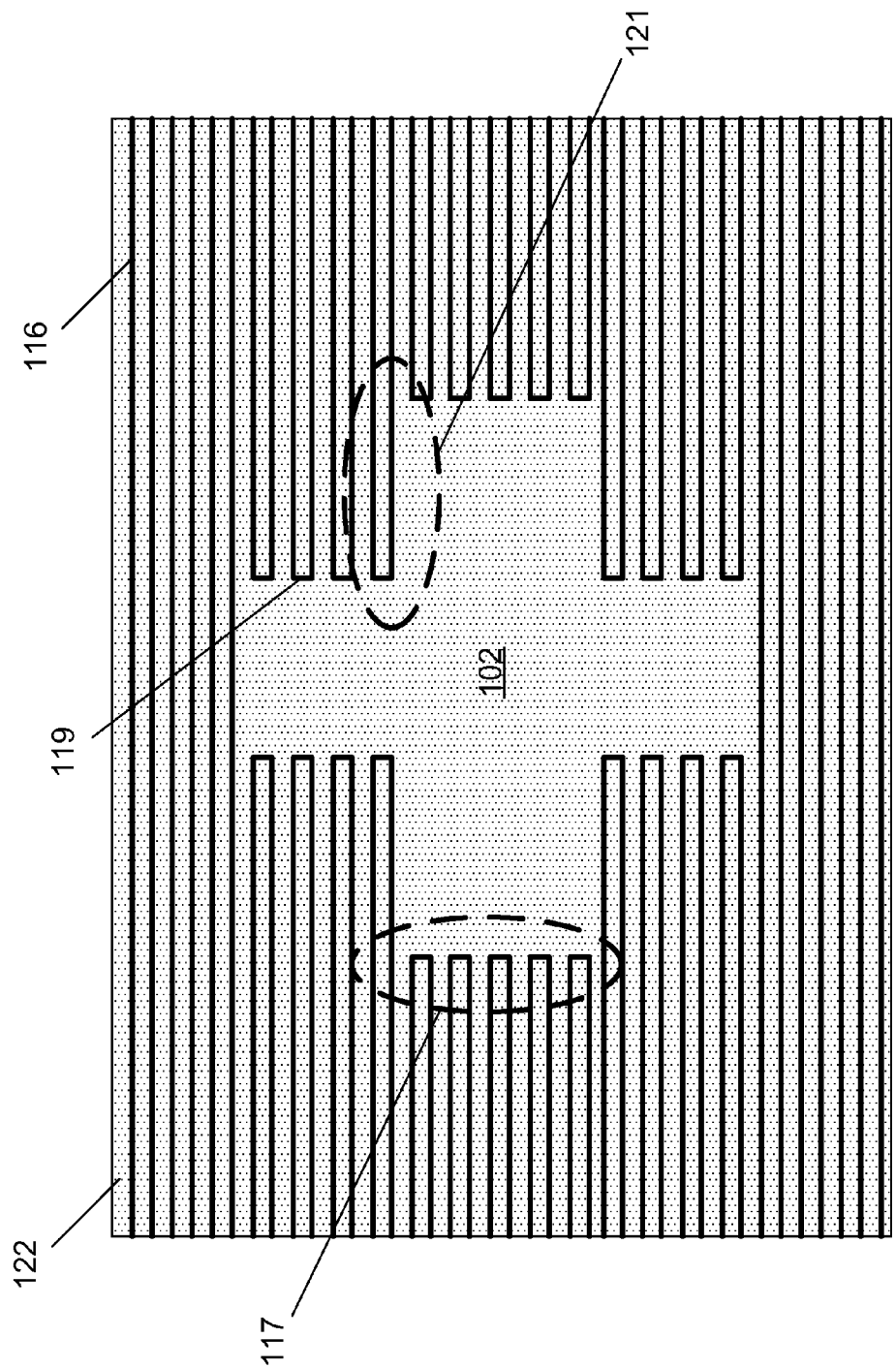

FIGS. 2A-2B depict simplified plan views of an illustrative integrated circuit product 100 with an illustrative alignment/overlay mark 102 formed therein. The methods disclosed herein may be employed to form alignment/overlay marks 102 of any desired size, shape or configuration. In the depicted example, the alignment/overlay mark 102 has an illustrative cross-shaped configuration. Also depicted in FIGS. 2A-2B are a plurality of fins 116 and an insulating material 122. The fins 116 and fin-like structures 119 referenced herein may be formed using any desired manufacturing technique and, thus, the inventions disclosed herein should not be considered to be limited to using any particular technique to form the fins 116 or the fin-like structures 119 described herein. In FIGS. 2A-2B, the fins 116 are depicted as isolated dark lines with the lighter insulating material 122, such as silicon dioxide, positioned between the fins 116. Using the methods disclosed herein, unlike the prior art methods, the bulk of the alignment structure 102 is comprised of the insulating material 122 while the outline of the alignment structure 102 is defined by the fins 116. By forming the alignment/overlay mark 102 primarily of the insulating material 122, some of the problems identified in the background section of the application may be avoided. For example, since the alignment/overlay mark 102 is surrounded by fin structures 116, the CMP processes performed to clear excess insulating material 122 (as described more fully below) are more predictable and less likely to produce excessive dishing. Moreover, the prior art problem of effectively destroying or consuming some of the relatively weak and limited number of fins that defined the prior art alignment mark 24 may be avoided. With continuing reference to FIG. 2A, the alignment/overlay mark 102 has regions 117 wherein the outline of the alignment/overlay mark 102 is effectively defined by "U" shaped silicon structures 119, and other regions 121 where the outline of the alignment/overlay mark 102 is effectively defined by the sides of the silicon fin structures 116. FIG. 2B depicts another example of an illustrative alignment/overlay mark 102 disclosed herein that is rotated ninety degrees relative to the alignment/overlay mark 102 shown in FIG. 2A.

Figure 2C:
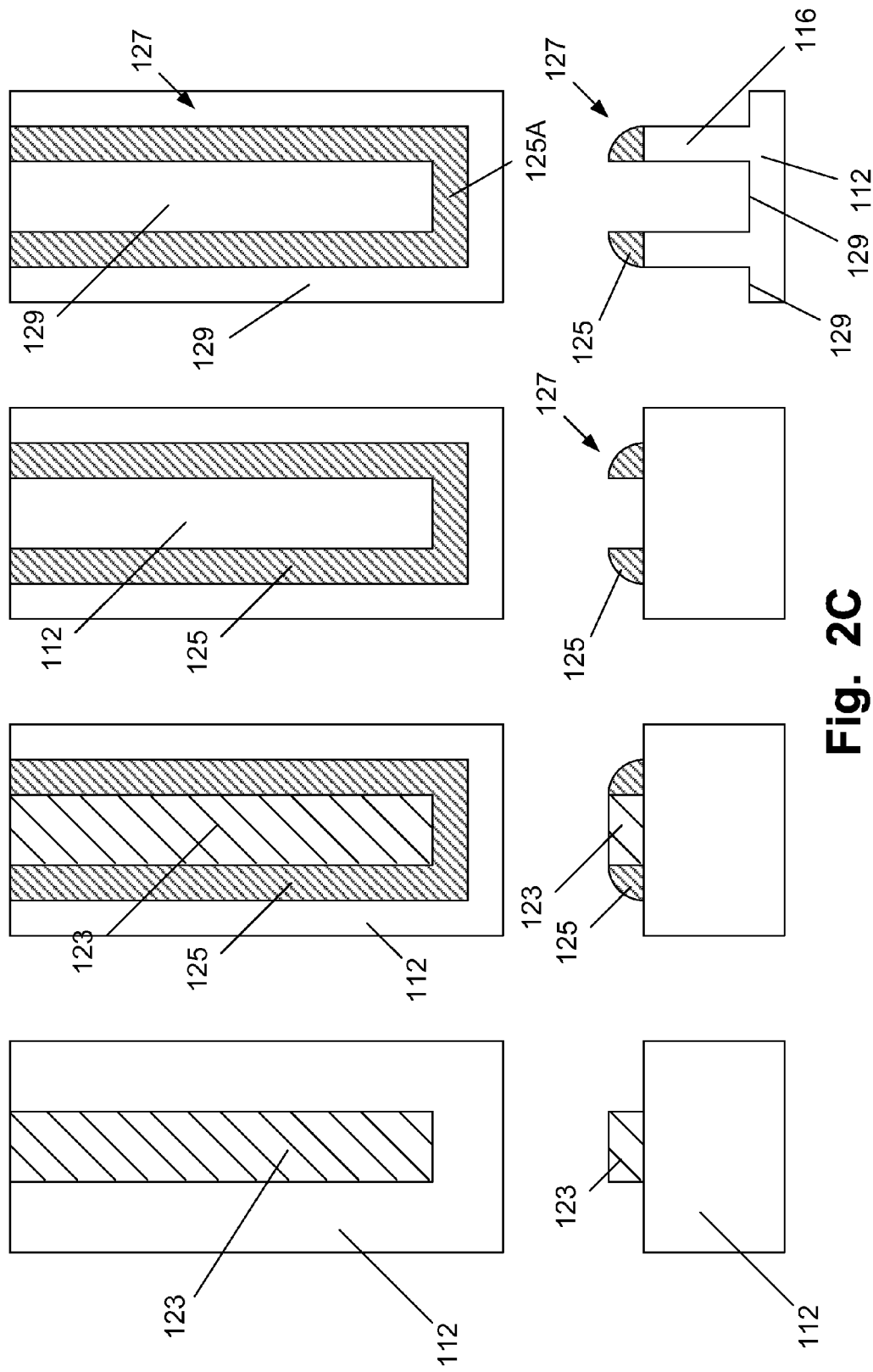

FIG. 2C is a very simplified series of four drawings that will be discussed to briefly explain the use of sidewall image transfer techniques, one illustrative technique that may be employed to define the patterned mask layer that may be employed in forming the fin-shaped structures 116, 119 depicted above. Each of the drawings includes a plan view (upper drawing) and a cross-sectional view (lower drawing) taken about midway of the plan view. In general, sidewall image transfer techniques involve the formation of a mandrel structure 123 above the semiconductor substrate 112, as shown in the left-most drawing. Of course, the mandrel structure 123 extends, and the final fin structures may extend for a great distance across the substrate 112, but only portions of such structures are depicted in FIG. 2C. The left-center drawing depicts the device after sidewall spacers 125 have been formed adjacent the mandrel structure 123. The spacers 125 may be formed by depositing a layer of spacer material and thereafter performing an anisotropic etching process, as is well known by those skilled in the art. Next, in the center-right drawing, the mandrel structure 123 is removed, which thereby exposes the portion of the substrate 112 previously covered by the mandrel structure 123 and defines a hard mask 127 comprised of the spacers 125. The lateral portion 125A of the spacer 125 will be used to cover what will be the bottom 119A of the U-shaped fin-like structures 119, as described more fully below. In the right-most drawing, an etching process is then performed through the patterned mask layer 127 to define a plurality of trenches 129 in the substrate 112 that effectively define the fins 116 and the U-shaped fin-like structures 119.

Figure 2D:
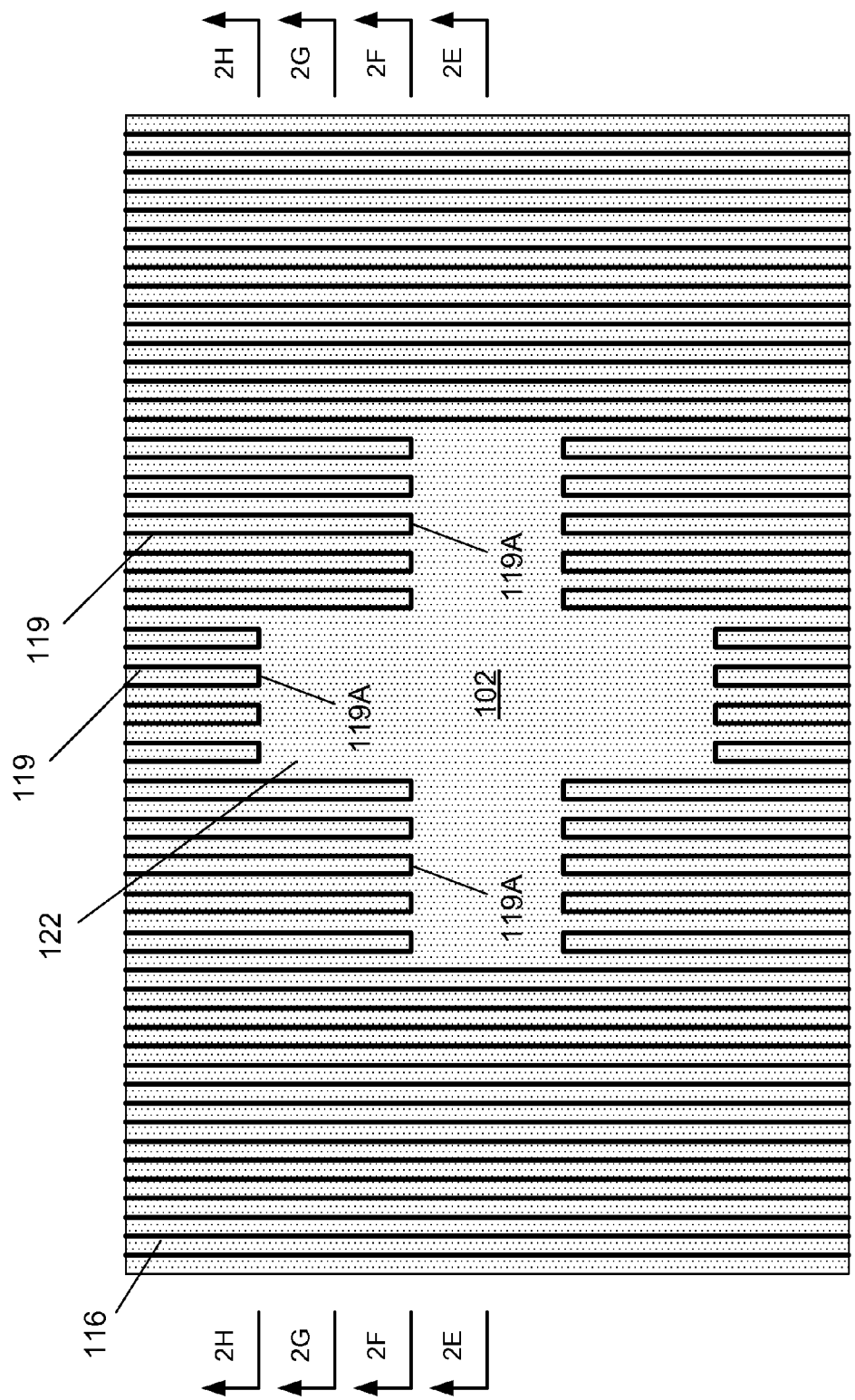
Figure 2L:
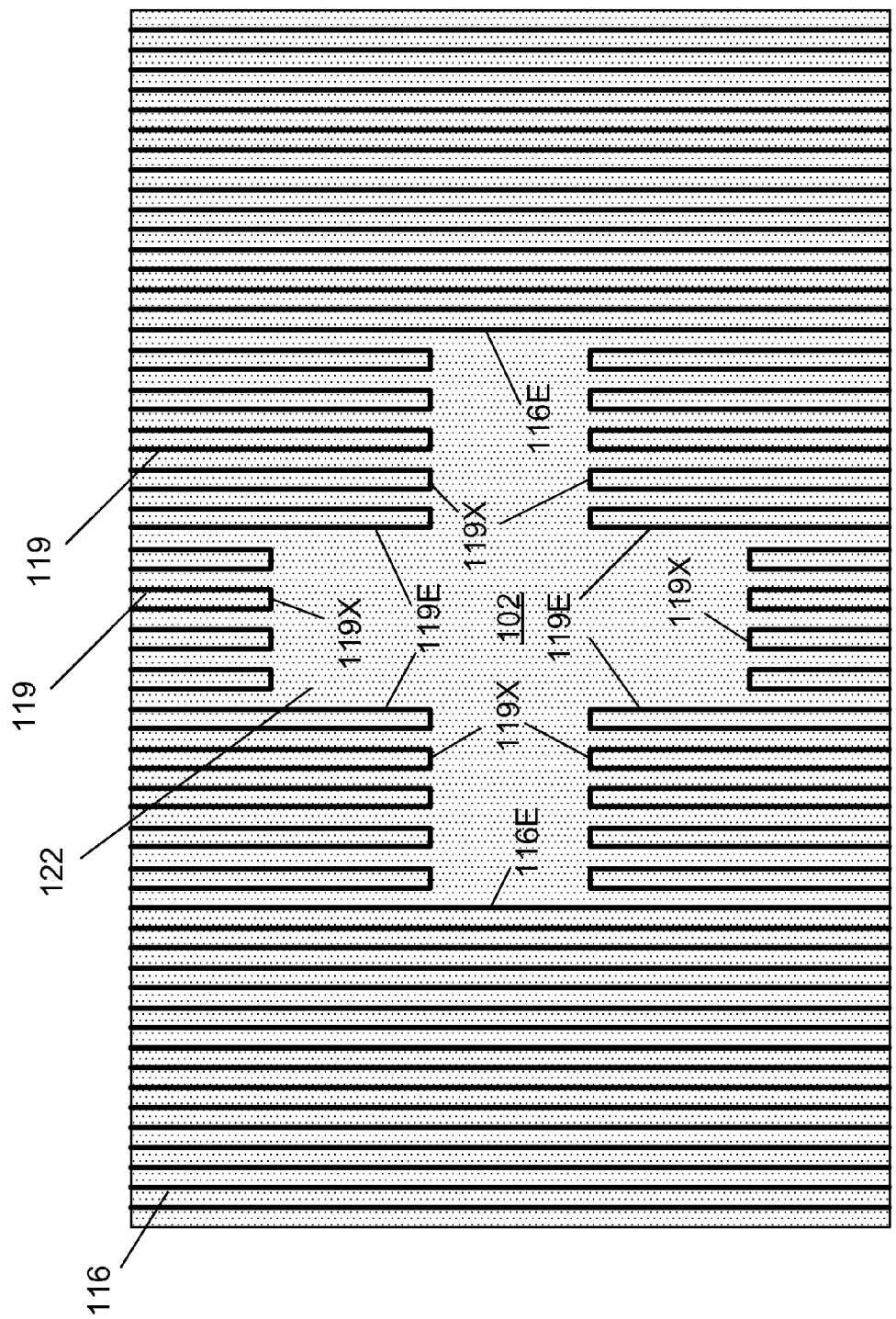

FIG. 2D is a copy of FIG. 2A wherein the location of various cross sectional views in the following drawings are taken for purposes of further explaining the illustrative embodiments of the novel alignment/overlay mark 102 disclosed herein. FIG. 2E is a cross-sectional view taken through the basic fin structures 116. FIG. 2G is a cross-sectional view taken through the basic fin structures 116 and the U-shaped fin structures 119. FIGS. 2F and 2H include views of the basic fin structures 116 and views taken through the end or bottom 119A of the U-shaped structures 119.

As indicated in FIGS. 2E-2H, the patterned mask layer 127 has been formed above the substrate 112 using the previously described sidewall image transfer techniques, and one or more etching processes has been performed on the substrate 112 through the patterned mask layer 127 to form a plurality of trenches 129. The trenches 129 define the basic fin structures 116 and the U-shaped fin structure 119. However, as noted above, the fins 116 and fin-like structures 119 referenced herein may be formed using any desired manufacturing technique. The spacers 125 have been depicted as having a simple rectangular configuration to facilitate drawing preparation. As will be described more fully below, the patterned mask layer 127 exposes portions of the substrate 112 where fin-forming trenches 129A will be formed to define the fin structures 116, 119 for the product 100, and an opening that exposes portions of the substrate 112 where an alignment/overlay mark trench 129B corresponding to an alignment/overlay mark 102 will be formed in the substrate 112. In some cases, such as the depicted example, the alignment/overlay mark trench 129B may be a contiguous trench structure having the shape of the alignment/overlay mark 102. In other cases, where the alignment/overlay mark 102 is comprised of several features, e.g., a plurality of separate linetype features arranged in a unique pattern, the alignment/overlay mark trench 129B depicted herein may correspond to only one of the trenches that would be required to form the multipart alignment mark.

The height and width of the fins 116 and fin-type structures 119 and the width of the fin-forming trenches 129A may vary depending upon the particular application. In one illustrative embodiment, the fins 116 and fin-forming trenches 129A may have physical dimensions similar to those described for the fins and trenches discussed in the background section of the application. As noted above, in the illustrative example depicted herein, the alignment/overlay mark trench 129B has the desired shape and configuration of the final alignment/overlay mark 102. In the illustrative examples depicted in the attached figures, the trenches 129 and the fin structures 116 are all of a uniform size and shape. However, such uniformity in the size and shape of the fins 116 is not required to practice at least some aspects of the inventions disclosed herein. In the example depicted herein, the trenches 129 are depicted as having been formed by performing one or more anisotropic etching processes. In some cases, the trenches 129A/129B may have a reentrant profile near the bottom of the trenches. To the extent the trenches 129 are formed by performing a wet etching process, the trenches may tend to have a more rounded configuration or non-linear configuration as compared to the generally linear configurations of the trenches 129 that are formed by performing an anisotropic etching process. Thus, the size and configuration of the trenches 129A/129B, and the manner in which they are made, should not be considered a limitation of the present invention.

The patterned mask layer 127 is intended to be representative in nature as it may be comprised of a variety of materials, such as, for example, silicon nitride, silicon oxynitride, silicon dioxide, etc. Moreover, the patterned mask layer 127 may be comprised of multiple layers of material, such as, for example, a silicon nitride layer and a layer of silicon dioxide. The patterned mask layer 127 may be formed by forming or depositing the layer(s) of material that comprise the mask layer 127 and thereafter directly patterning the mask layer 127 using known photolithography and etching techniques. Alternatively, as mentioned above, the patterned mask layer 127 may be formed by using known sidewall image transfer techniques. Thus, the particular form and composition of the patterned mask layer 127 and the manner in which it is made should not be considered a limitation of the present invention. In the case where the patterned mask layer 127 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

In FIGS. 2I-2K, the cross-sectional view shown in FIG. 2F will be used to demonstrate additional process operations that are performed on the product to complete the fabrication of the alignment/overlay mark 102. FIG. 2I depicts the product 100 after several process operations have been performed. Initially, a first layer of insulating material 138, such as a flowable oxide material or a spin-on glass (SOG) material, was formed in the trenches 129A/B. The first layer of insulating material 138 should be formed of a material that will reliably form in the spaces between adjacent fins 116, i.e., in the trenches 129A. In one illustrative embodiment, the upper surface 138S of the first layer of insulating material 138 may be about 30-100 nm below the upper surface 116S of the fins 116. In one illustrative embodiment, the first layer of insulating material 138 may be formed by performing a spin-coating process followed by performing a curing process. With continuing reference to FIG. 2I, a second layer of insulating material 140 is formed above the first layer of insulating material 138. The second layer of insulating material 140 may be formed by performing, for example, a CVD process such that it overfills the trenches 129A/B, as depicted in FIG. 2I. The second layer of insulating material may be comprised of a variety of materials, such as a layer of high density plasma (HDP) silicon dioxide, a CVD oxide, a CVD oxynitride, etc. Of course, if desired, instead of using two layers of insulating material to overfill the trenches 129A/B, as described above, the trenches 129A/B may be filled with a single layer of insulating material.

FIG. 2J depicts the product 100 after one or more chemical mechanical polishing (CMP) processes have been performed to remove the portions of the second layer of insulating material 140 positioned outside of the trenches 129A/B and above the patterned mask layer 127 while using the patterned mask layer 127 as a polish-stop layer. If desired, this planarization process could be accomplished by performing an etch-back process.

FIG. 2K depicts the product 100 after one or more CMP processes have been performed to remove the patterned hard mask layer 127 and to planarize the upper surface 140S of the second layer of insulating material 140 with the now-exposed upper surface 116S of the fins 116/119 and the surface 112S of the substrate 112. If desired, this planarization process could be accomplished by performing an etch-back process.

The planarization processes depicted in FIGS. 2J-K effectively define the illustrative cross-shaped alignment/overlay mark 102.

As can be seen with reference to FIG. 2L and FIGS. 2E-2H, the alignment/overlay mark 102 has a perimeter that is partially defined by the substantially vertically oriented sidewall of the fin structures 116, 119, i.e., the terminal end sidewalls 119X of the spaced-apart fin structures 119, and by portions of the substantially vertically oriented longitudinal sidewalls 116E, 119E of the fin structures 116, 119. In effect, the sidewall surfaces 116E, 119E and 119X partially define an alignment/overlay mark trench that is subsequently filled with one or more layers of insulating material to form the final alignment/overlay mark 102. The upper surfaces 116S, 119S of those spaced-apart fin structures also partially defines portions of the perimeter of the alignment/overlay mark 102. Of course, the upper surfaces 116S, 119S are also the upper surface 112S of the substrate material 112. The depicted alignment/overlay mark 102 is intended to be representative in nature in that it represents any type of alignment/overlay mark that may be employed in manufacturing semiconductor devices. The alignment/overlay mark 102 may be of any style or configuration (e.g., a cross, a chevron pattern, a grating pattern, a number, a letter, etc.) and the number and location of such an alignment/overlay mark may vary depending on the particular application and/or the product under construction. For example, one or more of the illustrative alignment/overlay marks 102 may be located on one or more of the scribe lines (not shown) of the substrate 112. As one example, four of the illustrative alignment/overlay marks 102 may be provided for every "flash-field" that will be employed during photolithography operations. Thus, the presently disclosed inventions should not be considered as limited to any particular type, size, number or configuration of alignment/overlay marks 102, nor to the way such alignment/overlay marks 102 are made or positioned. The alignment/overlay mark 102 is positioned such that there is sufficient substrate material surrounding the alignment/overlay mark 102, which is made of insulating material, such that there is a sharp contrast between the alignment/overlay mark 102 and the surrounding fin structures to make detection of the alignment/overlay mark 102 and alignment relative to the alignment/overlay mark 102 easier to accomplish.

The novel alignment/overlay mark 102 disclosed herein, and the manner in which it is made, provides significant advantages relative to the prior art alignment mark 24 discussed in the background section of this application. For example, since the alignment/overlay mark 102 disclosed herein is effectively defined by filling a relatively large trench, as defined by the spaced-apart fin structures 116, 119, with at least one insulating material and thereafter performing a CMP process, the problems associated with making the prior art alignment mark 24 out of a group or collection of the small fins 16, as described in the background section of the application, may be avoided. More specifically, since the body of the alignment/overlay mark 102 disclosed herein is not made of relatively small fin structures, it is much more robust and does not experience the degradation as is typically the case for the alignment mark 24 described in the background section of this application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a plurality of spaced-apart fin structures in a semiconductor substrate, wherein edges of said fin structures define an outline of an alignment/overlay mark trench where an alignment/overlay mark will be formed;
    forming at least one layer of insulating material that overfills said alignment/overlay mark trench; and
    removing excess portions of said at least one layer of insulating material positioned above an upper surface of said plurality of fins, wherein an entirety of said alignment/overlay mark is defined by said alignment/overlay mark trench, wherein said alignment/overlay mark is devoid of any of said fin structures.

2. The method of claim 1, wherein removing excess portions of said at least one layer of insulating material comprises performing one of a chemical mechanical polishing process or an etch-back process.

3. The method of claim 1, wherein forming a plurality of spaced-apart fin structures in a semiconductor substrate comprises:
    forming a patterned mask layer above said semiconducting substrate; and
    performing at least one etching process through said patterned mask layer on said substrate to thereby define said plurality of fins.

4. The method of claim 3, wherein removing excess portions of said at least one layer of insulating material positioned above an upper surface of said plurality of fins comprises:
    performing at least one first chemical mechanical polishing process to remove a first portion of said at least one layer of insulating material, wherein said at least one first chemical mechanical polishing process stops on or within said patterned mask layer; and
    performing at least one second chemical mechanical polishing process to remove a second portion of at least one layer of insulating material, wherein said at least one second chemical mechanical polishing process stops on said plurality of fins.

5. The method of claim 3, wherein said patterned mask layer is formed using a sidewall image transfer method.

6. The method of claim 1, wherein said alignment/overlay mark, when viewed from above, has one of a cross configuration, a chevron configuration, a grating pattern configuration, a number configuration or a letter configuration.

7. The method of claim 1, wherein said patterned mask layer is comprised of at least one of silicon nitride or silicon dioxide.

8. The method of claim 1, wherein sidewalls of said fin structures partially define a perimeter of said alignment/overlay mark.

9. The method of claim 1, wherein at least some of said plurality of fin structures have a U-shaped configuration when viewed from above.

10. The method of claim 9, wherein a bottom of said U-shaped configuration at least partially defines a perimeter of said alignment/overlay mark trench.

11. A method, comprising:
    forming a patterned mask layer above a semiconducting substrate;

performing at least one etching process through said patterned mask layer on said substrate to thereby define a plurality of spaced-apart fin structures in said substrate, wherein sidewalls and ends of said fin structures define an outline of an alignment/overlay mark trench where an alignment/overlay mark will be formed;

forming at least one layer of insulating material that overfills said alignment/overlay mark trench; and removing excess portions of said at least one layer of insulating material positioned above an upper surface of said plurality of fins, wherein an entirety of said alignment/overlay mark is defined by said alignment/overlay mark trench, wherein said alignment/overlay mark is devoid of any of said fin structures.

12. The method of claim 11, wherein removing excess portions of said at least one layer of insulating material comprises performing one of a chemical mechanical polishing process or an etch-back process.

13. The method of claim 11, wherein removing excess portions of said at least one layer of insulating material positioned above an upper surface of said plurality of fins comprises:

performing at least one first chemical mechanical polishing process to remove a first portion of said at least one layer of insulating material, wherein said at least one first chemical mechanical polishing process stops on or within said patterned mask layer; and performing at least one second chemical mechanical polishing process to remove a second portion of at least one layer of insulating material, wherein said at least one second chemical mechanical polishing process stops on said plurality of fins.

14. The method of claim 11, wherein said patterned mask layer is formed using a sidewall image transfer method.

15. The method of claim 11, wherein at least some of said plurality of fin structures have a U-shaped configuration when viewed from above.

16. The method of claim 15, wherein a bottom of said U-shaped configuration at least partially defines a perimeter of said alignment/overlay mark trench.

* * * * *